US012740086B2

(12) United States Patent
Coffie

(10) Patent No.: US 12,740,086 B2
(45) Date of Patent: Sep. 15, 2026

(54) FET DEVICE WITH AlGaN BUFFER LAYER AND THIN InGaN LAYER

(71) Applicant: NORTHROP GRUMMAN SYSTEMS CORPORATION, Falls Church, VA (US)

(72) Inventor: Robert Coffie, Plano, TX (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 798 days.

(21) Appl. No.: 18/049,064

(22) Filed: Oct. 24, 2022

(65) Prior Publication Data

US 2024/0136431 A1 Apr. 25, 2024
US 2024/0234560 A9 Jul. 11, 2024

(51) Int. Cl.

*H10D 30/47* (2025.01)
*H10D 62/824* (2025.01)
*H10D 62/85* (2025.01)

(52) U.S. Cl.

CPC ......... *H10D 30/475* (2025.01); *H10D 62/824* (2025.01); *H10D 62/8503* (2025.01)

(58) Field of Classification Search

CPC ............... H10D 30/475; H10D 62/824; H10D 62/8503; H10D 30/4732
See application file for complete search history.

(56) References Cited

U.S. PATENT DOCUMENTS 8,476,125 B2 7/2013 Kahn et al.
2004/0238842 A1* 12/2004 Micovic ............... H10D 30/015 257/E29.253
2009/0218599 A1* 9/2009 Mishra ................. H10D 30/015 257/E29.246
2010/0102359 A1* 4/2010 Khan .................. H10D 30/015 257/E21.403
2010/0187570 A1* 7/2010 Saxler ................. H10D 30/015 257/192

(Continued)

OTHER PUBLICATIONS

T. Palacios, A. Chakraborty, S. Heikman, S. Keller, S. P. Denbaars and U. K. Mishra, "AlGaN/GaN high electron mobility transistors with InGaN back-barriers," in IEEE Electron Device Letters, vol. 27, No. 1, pp. 13-15, Jan. 2006, doi: 10.1109/LED.2005.860882.

(Continued)

*Primary Examiner* — Norman D Richards
*Assistant Examiner* — Ethan Edward Cutler
(74) *Attorney, Agent, or Firm* — John A. Miller; Shumaker, Loop & Kendrick, LLP

(57) ABSTRACT

A high electron mobility transistor (HEMT) device including a substrate, an AlGaN buffer layer on the substrate, where the buffer layer has a percentage of Al between 1% and 6%, an InGaN layer on the buffer layer, where the InGaN layer has about 10% of In, a GaN channel layer on the InGaN layer, and an AlGaN barrier layer on the channel layer. In one embodiment, the buffer layer is $Al_{0.04}Ga_{0.96}N$, the InGaN layer is about 2 nm thick, and the barrier layer is $Al_{0.34}Ga_{0.66}N$. The HEMT device may include a nucleation layer between the substrate and the buffer layer, a GaN spacer layer between the buffer layer and the InGaN layer, and/or an AlN interlayer between the channel layer and the barrier layer.

19 Claims, 2 Drawing Sheets

(56) References Cited

U.S. PATENT DOCUMENTS

| | | | | |
|---|---|---|---|---|
| 2013/0207078 | A1 | 8/2013 | Cao et al. | |
| 2014/0252366 | A1 | 9/2014 | Gao | |
| 2017/0250273 | A1 * | 8/2017 | Schultz | H10D 30/4732 |

OTHER PUBLICATIONS

J. Liu, Y. Zhou, J. Zhu, Y. Cai, K. M. Lau and K. J. Chen, "DC and RF Characteristics of AlGaN/GaN/InGaN/GaN Double-Heterojunction HEMTs," in IEEE Transactions on Electron Devices, vol. 54, No. 1, pp. 2-10, Jan. 2007, doi: 10.1109/TED.2006.887045.

"A Normally—off P-Gate AlGaN/GaN HEMT for High Power Application", 2018 IEEE International Conference on Electron Devices and Solid State Circuits (EDSSC), IEEE, Jun. 6, 2018, pp. 1-2.

* cited by examiner

FET DEVICE WITH AlGaN BUFFER LAYER AND THIN InGaN LAYER

BACKGROUND

Field

This disclosure relates generally to a gallium nitride (GaN) based high electron mobility transistor (HEMT) and, more particularly, to a GaN based HEMT including a low Al % AlGaN buffer layer and a thin InGaN layer.

Discussion

Field-effect transistors (FET) are well known in the transistor art, and come in a variety of types, such a HEMT, MOSFET, MISFET, FinFET, etc. A typical FET will include various semiconductor layers, such as silicon, gallium arsenide (GaAs), indium gallium arsenide (InGaAs), indium aluminum arsenide (InAlAs), gallium nitride (GaN), indium phosphide (InP), etc. Sometimes the semiconductor layers are doped with various impurities, such as boron and silicon, to increase the population of carriers in the layer, where the higher the doping level of the layer the greater the conductivity of the particular semiconductor material. An FET will also include a source terminal, a drain terminal and a gate terminal, where one or more of the semiconductor layers is a channel layer and is in electrical contact with the source and drain terminals. An electrical potential difference applied between the source and drain terminals allows electrical carriers, either N-type or P-type, to flow through the channel layer between the source and drain terminals. An electric signal applied to the gate terminal creates an electrical field that modulates the carriers in the channel layer, where a small change in the gate voltage can cause a large variation in the population of carriers in the channel layer to change the current flow from between the source terminal and drain terminals.

HEMT devices are popular transistor devices that have many applications, especially high frequency or high-speed applications. GaN HEMT devices are typically epitaxialy grown on a suitable substrate, such as silicon carbide (SiC), sapphire, silicon, etc., all well known to those skilled in the art. A typical HEMT device may have a SiC substrate that includes alternating crystalline layers of silicon and carbon. A nucleation layer, such as an AlN layer, is often deposited on the SiC substrate to help facilitate epitaxial growth, where the nucleation layer is grown on the side of the substrate having a silicon face so that the orientation of the crystalline structure of the nucleation layer, and the subsequent device layers, has a gallium orientation. A buffer layer is typically grown on the nucleation layer that provides a crystalline structure having limited defects, where the buffer layer is typically GaN or low Al % AlGaN. A GaN channel layer is deposited on the buffer layer and an AlGaN barrier layer is deposited on the channel layer, where a two-dimensional electron gas (2-DEG) layer for the flow of electrons is created at the interface between the channel layer and the barrier layer.

Two approaches are currently employed in the art to create the back-barrier for AlGaN/GaN HEMTs. The first approach employs a thin InGaN layer between the GaN channel layer and the GaN buffer layer, and the second approach grows the GaN channel layer on top of a low Al % AlGaN buffer layer. The first approach produces a higher breakdown voltage and a lower thermal resistance from the channel layer to the backside of the wafer than the second approach. The turn-off characteristics of the HEMT for the first approach is not as sharp as the second approach. At low voltages, this translates into a lower transconductance, a more negative pinch-off voltage and a lower RF gain of the HEMT than the second approach. However, the second approach produces a lower breakdown voltage and a higher thermal resistance from the channel layer to backside of wafer compared to the first approach.

The first approach uses polarization in the thin InGaN layer to create the voltage independent conduction band back-barrier and it is typically located at least 10 nm from the AlGaN/GaN interface. To produce a large enough barrier in the conduction band, a thickness and an In % that results in the conduction band in the InGaN crossing, or very close to crossing, the Fermi-level needs to be used. Since the InGaN conduction band crosses the Fermi-level, some electrons exist in the InGaN layer, which results in a transition from the HEMT's off-state to on-state that is less steep with the gate voltage compared to HEMT's without the InGaN layer.

The second approach grows the GaN channel layer on a low Al % AlGaN. The difference in the lattice constants between the AlGaN and the GaN produces a net polarization charge at the GaN channel/AlGaN buffer interface. This polarization charge produces an electric field in the channel layer that further confines the electrons to the AlGaN barrier/GaN channel interface. The conduction band increase in the channel layer is the polarization electric field time the thickness of the channel layer. This results in a thickness of ~50 nm to produce a large conduction band rise in the channel layer. Due to the low Al % in the AlGaN buffer layer, the conduction band discontinuity between the AlGaN buffer layer and the GaN channel layer contributes very little to any confinement of electrons in the channel layer. As the drain voltage increases, short channel effects can occur and an electric field due to the drain voltage can offset the electric field due to polarization. When this occurs, confinement of electrons in the channel layer is reduced and the AlGaN buffer layer approach is no longer effective. This results in a lower breakdown voltage compared to the first approach.

DETAILED DESCRIPTION OF THE EMBODIMENTS

The following discussion of the embodiments of the disclosure directed to a GaN based HEMT including a low Al % AlGaN buffer layer and a thin InGaN layer is merely exemplary in nature, and is in no way intended to limit the disclosure or its applications or uses.

As will be discussed in detail below, this disclosure proposes an HEMT that provides improvements in the confinement of electrons in the device channel layer for all voltages during operation of the HEMT, which leads to improved RF performance of the HEMT over known devices. The new approach inserts a thin InGaN layer into the GaN channel layer that is grown on a low Al % AlGaN buffer layer. The polarization electric field due to the lattice constant difference between the GaN layer and the AlGaN buffer layer prevents the conduction band of the InGaN layer from crossing the Fermi level and maintains the steep transition from the off-state to the on-state with gate voltage obtained from the second approach discussed above. When the drain voltage is increased, the polarization electric field may be offset by an electric field produced by the drain voltage, and the confinement of electrons to the channel layer is now provided by a conduction band barrier produced by the thin InGaN layer. This results in breakdown voltages that are higher than the second approach could produce for the same design.

Figure 1:
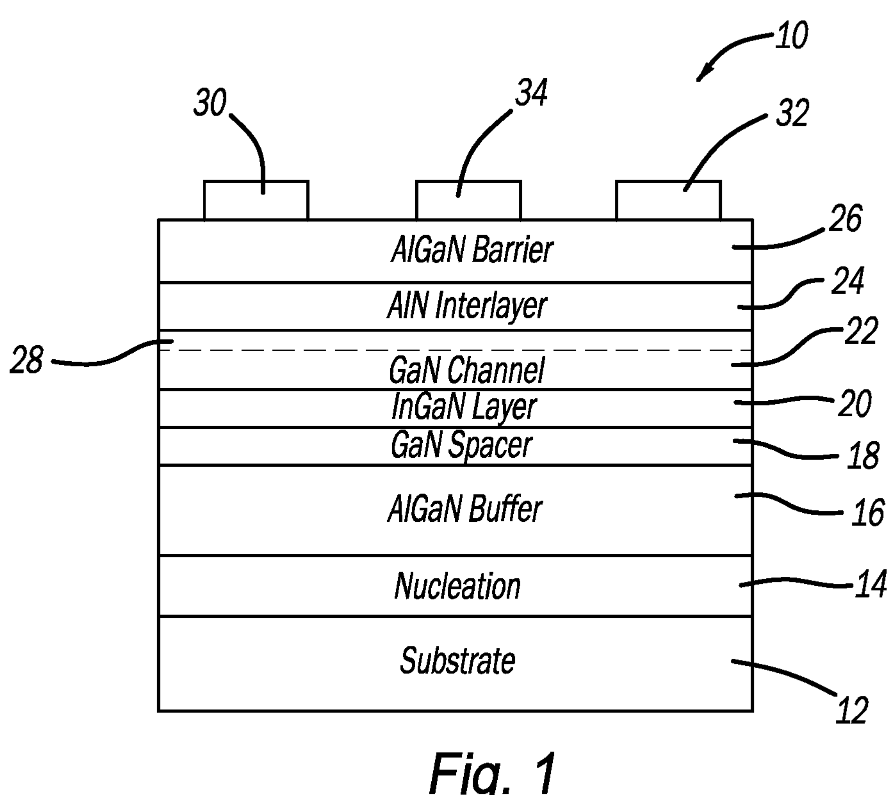
FIG. 1 is a profile view of an AlGaN HEMT device with a low Al % AlGaN buffer layer and a thin InGaN layer.

FIG. 1 is a device profile of an HEMT device 10 including a substrate 12 on which the various epitaxial or device layers of the HEMT device 10 are deposited or grown using known epitaxial growth techniques. The substrate 12 can be any substrate suitable for the purposes discussed herein, such as SiC, sapphire, GaN, AlN, Si, etc. A nucleation layer 14 is grown on the substrate 12 to provide a base layer for proper epitaxial growth of the device layers, and can be, for example, GaN, AlGaN or AlN. An AlGaN buffer layer 16 is grown on the nucleation layer 14, and for reasons that will be discussed below has a low percentage, for example, 1%-6%, of Al. In one non-limiting embodiment, the buffer layer 16 is $Al_{0.04}Ga_{0.96}N$. A GaN spacer layer 18 is grown on the buffer layer 16 and a thin InGaN layer 20 is grown on the spacer layer 18 having a thickness that is less than 20 nm. In one embodiment, the thin layer 20 is $In_{0.1}Ga_{0.9}N$, is about 2 nm thick and has an In composition of about 10%. A GaN channel layer 22 is grown on the thin layer 20 and an optional AlN interlayer 24 is grown on the channel layer 22. An AlGaN barrier layer 26 is grown on the interlayer 24, where the piezoelectric/spontaneous polarization effect between the AlGaN barrier layer 26 and the GaN channel layer 22 generates a 2-DEG layer 28 between the interlayer 24 and the channel layer 22. In one non-limiting embodiment, the barrier layer 26 is $Al_{0.34}Ga_{0.66}N$. Suitable patterning and metal deposition steps are performed to provide a source terminal 30, a drain terminal 32 and a gate terminal 34 on the barrier layer 26.

Figure 2:
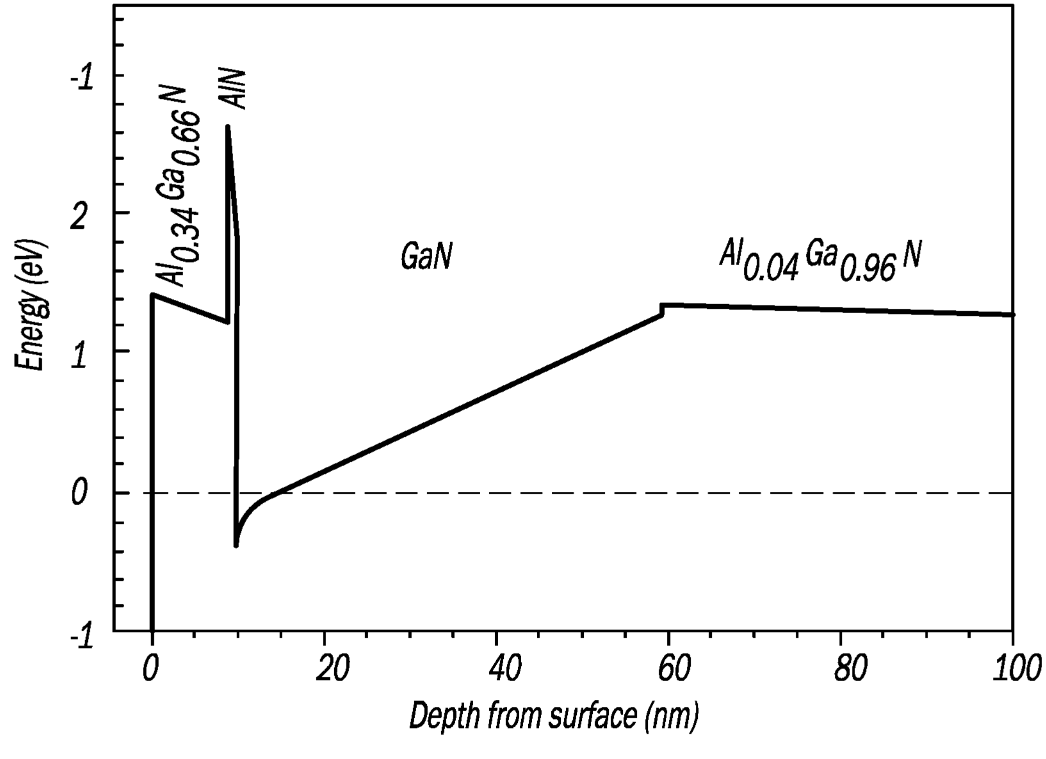
FIG. 2 is a conduction band diagram of the AlGaN HEMT device shown in FIG. 1, but where the thin InGaN layer has been removed.
Figure 3:
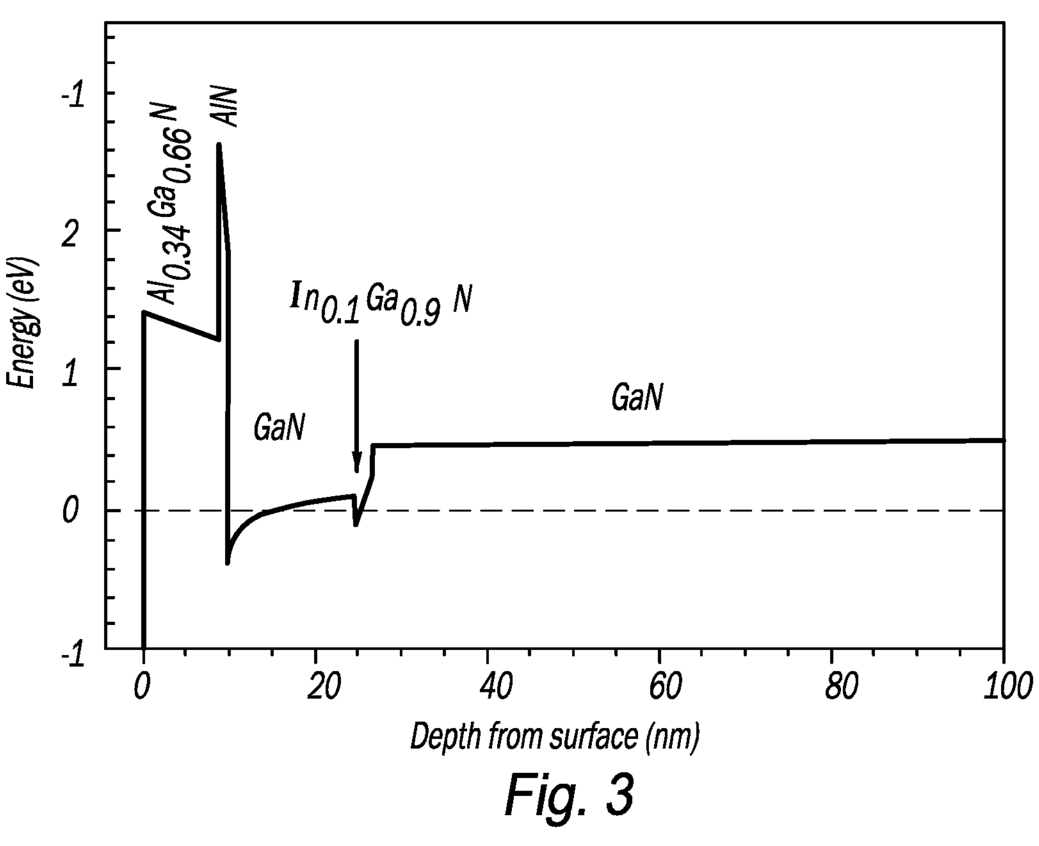
FIG. 3 is a conduction band diagram of the AlGaN HEMT device shown in FIG. 1, but where the low Al % AlGaN buffer layer is replaced with a GaN buffer layer.
Figure 4:
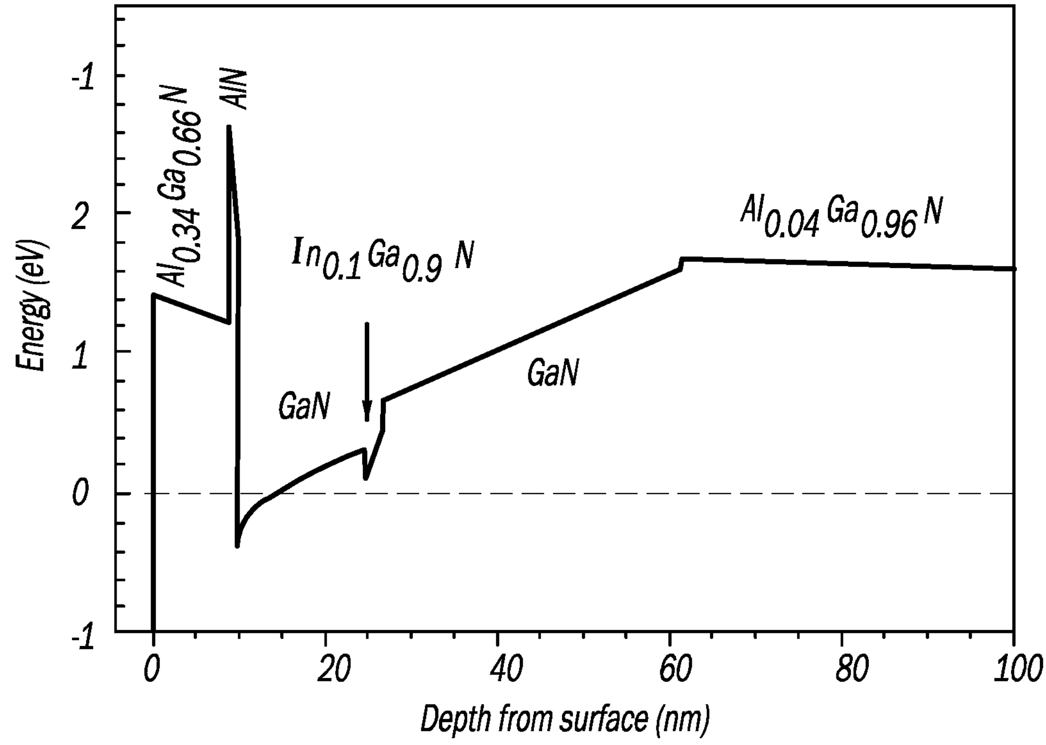
FIG. 4 is a conduction band diagram of the AlGaN HEMT device shown in FIG. 1.

FIG. 2 is a conduction band diagram of the AlGaN HEMT device 10, but where the thin InGaN layer 20 has been removed, FIG. 3 is a conduction band diagram of the AlGaN HEMT device 10, but where the low Al % AlGaN buffer layer 16 is replaced with a GaN buffer layer, and FIG. 4 is a conduction band diagram of the AlGaN HEMT device 10.

As shown in FIG. 2, the primary confinement mechanism to keep electrons at the interface between the barrier layer 26 and the interlayer 24 is the polarization induced electric field that results from the lattice constant mismatch between the GaN channel layer 22 and the low Al % AlGaN buffer layer 16. This electric field can be offset by short channel effects at high drain voltages, which then results in low breakdown voltage.

As shown in FIG. 3, the thin InGaN layer 20 produces a barrier in the conduction band between the GaN channel layer 22 and the GaN buffer layer that replaced the buffer layer 16. In order to produce a large enough barrier, an In % of about 10% is used in the layer 20, but this results in the conduction band in the InGaN layer 20 crossing the Fermi level. When the conduction band of the InGaN layer 20 is close to the Fermi level, electrons begin to populate the layer 20, which produces a less steep transition from the off-state to the on-state with the gate voltage. This results in a more negative pinch-off voltage, smaller transconductance and a lower RF gain. The shift in the conduction band in the thin InGaN layer 20 is due to the polarization in the thin InGaN layer 20 that is not influenced by the drain voltage. This allows confinement to high voltages (unlike the AlGaN buffer confinement approach), thus resulting in a high breakdown voltage.

As shown in FIG. 4, the thin InGaN layer 20 produces a barrier in the conduction band between the GaN channel layer 22 and the GaN spacer layer 18 that is not dependent on external electric fields. Growing the spacer layer 18 on the low Al % AlGaN buffer layer 16 produces a polarization electric field that exists in the GaN channel layer 22, the InGaN layer 20 and the GaN spacer layer 18. This polarization electric field prevents electrons from occupying the InGaN layer 26 at low voltages providing the desired steep transition from the off-state to the on-state with gate voltage, high transconductance, and high RF gain at lower voltages. At high voltages where the polarization electric field due to growing on the low Al % AlGaN buffer layer 16 can be offset by the drain voltage from short channel effects, the barrier produced in the conduction band by the InGaN layer 20 between the GaN channel layer 22 and the GaN spacer layer 18 is still present resulting in high breakdown voltage.

The foregoing discussion discloses and describes merely exemplary embodiments of the present disclosure. One skilled in the art will readily recognize from such discussion and from the accompanying drawings and claims that various changes, modifications and variations can be made therein without departing from the spirit and scope of the disclosure as defined in the following claims.

What is claimed is:

1. A field effect transistor (FET) device comprising:
- a substrate;
- an AlGaN buffer layer on the substrate, said buffer layer having a percentage of Al that is less than 10%;
- an InGaN layer on the buffer layer, said InGaN layer having a thickness that is less than 20 nm;
- a GaN spacer layer between and in contact with the buffer layer and the InGaN layer;
- a channel layer on the InGaN layer; and
- a barrier layer on the channel layer.

2. The FET device according to claim 1 wherein the percentage of Al in the buffer layer is between 1% and 6%.

3. The FET device according to claim 1 wherein the buffer layer is $Al_{0.04}Ga_{0.96}N$.

4. The FET device according to claim 1 wherein the InGaN layer has a percentage of In of about 10%.

5. The FET device according to claim 4 wherein the InGaN layer is $In_{0.1}Ga_{0.9}N$.

6. The FET device according to claim 1 wherein the InGaN layer has a thickness of about 2 nm.

7. The FET device according to claim 1 wherein the channel layer is GaN.

8. The FET device according to claim 1 wherein the barrier layer is AlGaN.

9. The FET device according to claim 8 wherein the barrier layer is $Al_{0.34}Ga_{0.66}N$.

10. The FET device according to claim 1 further comprising a nucleation layer between the substrate and the buffer layer.

11. The FET device according to claim 1 further comprising a AlN interlayer between the channel layer and the barrier layer.

12. The FET device according to claim 1 wherein the substrate is an SiC, sapphire, GaN, AlN or Si substrate.

13. The FET device according to claim 1 wherein the FET device is a high electron mobility transistor device.

14. A high electron mobility transistor (HEMT) device comprising:

a substrate;

an AlGaN buffer layer on the substrate, said buffer layer having a percentage of Al that is between 1% and 6%;

an InGaN layer on the buffer layer, said InGaN layer having about 10% of In;

a GaN spacer layer between and in contact with the buffer layer and the InGaN layer;

a GaN channel layer on the InGaN layer; and an AlGaN barrier layer on the channel layer.

15. The HEMT device according to claim 14 wherein the buffer layer is $Al_{0.04}Ga_{0.96}N$.

16. The HEMT device according to claim 14 wherein the InGaN layer is about 2 nm thick.

17. The HEMT device according to claim 14 wherein the barrier layer is $Al_{0.34}Ga_{0.66}N$.

18. The HEMT device according to claim 14 further comprising a nucleation layer between the substrate and the buffer layer and an AlN interlayer between the channel layer and the barrier layer.

19. A high electron mobility transistor (HEMT) device comprising:

a substrate;

a nucleation layer on the substrate;

an AlGaN buffer layer on the nucleation layer, said buffer layer having a percentage of Al of about 4%;

a GaN spacer layer on and in contact with the buffer layer;

an InGaN layer on and in contact with the spacer layer, said InGaN layer having about 10% of In and a thickness of about 2 nm;

a GaN channel layer on the InGaN layer;

an AlN interlayer on the channel layer; and an AlGaN barrier layer on the interlayer layer.

* * * * *